United States Patent

Shibata

[11] Patent Number: 5,814,541
[45] Date of Patent: Sep. 29, 1998

[54] METHOD FOR MANUFACTURING SEMICONDUCTOR DEVICE

[75] Inventor: Hideki Shibata, Yokohama, Japan

[73] Assignee: Kabushiki Kaisha Toshiba, Kawasaki, Japan

[21] Appl. No.: 425,234

[22] Filed: Apr. 18, 1995

Related U.S. Application Data

[63] Continuation of Ser. No. 194,644, Feb. 10, 1994, abandoned, which is a continuation of Ser. No. 49,670, Apr. 21, 1993, abandoned, which is a continuation of Ser. No. 887,382, May 21, 1992, abandoned, which is a continuation of Ser. No. 683,081, Apr. 9, 1991, abandoned, which is a continuation of Ser. No. 279,621, Dec. 5, 1988, abandoned.

[30] Foreign Application Priority Data

Dec. 4, 1987 [JP] Japan .................................. 62-307010

[51] Int. Cl.$^6$ ................................................. H01L 21/225
[52] U.S. Cl. ........................... 438/232; 438/233; 438/546; 438/564
[58] Field of Search ................................ 437/27–30, 160, 437/162, 163, 164, 191, 150, 151, 186, 953, 954; 257/917, 377, 381–385; 438/231, 232, 233, 546, 564, 196, 310, 322, 346, 465

[56] References Cited

U.S. PATENT DOCUMENTS

| | | | |
|---|---|---|---|
| 4,276,688 | 7/1981 | Hsu ......................................... | 257/377 |
| 4,322,736 | 3/1982 | Sasaki et al. . | |
| 4,333,099 | 6/1982 | Tanguay et al. . | |
| 4,374,700 | 2/1983 | Scott et al. .............................. | 257/377 |
| 4,629,520 | 12/1986 | Ueno et al. .............................. | 437/31 |
| 4,666,557 | 5/1987 | Collins et al. .......................... | 156/643 |
| 4,792,841 | 12/1988 | Nagasawa et al. ...................... | 257/385 |
| 5,376,577 | 12/1994 | Roberts et al. ......................... | 437/162 |
| 5,525,552 | 6/1996 | Huang ..................................... | 437/183 |
| 5,536,683 | 7/1996 | Lin et al. ................................. | 437/186 |
| 5,554,549 | 9/1996 | Huang ..................................... | 437/186 |

FOREIGN PATENT DOCUMENTS

| | | |
|---|---|---|
| 0430166 | 12/1989 | European Pat. Off. . |
| 53-27372 | 3/1978 | Japan . |
| 53-147473 | 12/1978 | Japan . |
| 59-2191 | 1/1984 | Japan . |
| 63-293858 | 11/1988 | Japan . |
| 3-109736 | 5/1991 | Japan . |

OTHER PUBLICATIONS

Satoh et al., 1982 Symposium on VLSI Techn. Digest of Papers (Sep. 1982), pp. 38–39.
Kwong et al., Thin Solid Films, 161 (1988) pp. 131–137.
Rathnam et al., IEDM 1983, pp. 237–241.
Hsia et al, "Polysilicon Oxidation Self–Aligned MOS (POSAMOS)—A new Self–Aligned Double Source/Drain Ion Implantation Technique For VLSI", IEEE Electron Device Letters, vol. ED–3, No. 2, Feb. 1982, pp. 40–42.
Ogura et al, "Design and Characteristics of the Lightly Doped Drain–Soiurce (LDD) Insulated Gate Field–Effect Transistor", IEEE Transactions on Electron Devices, vol. ED–27, No. 8, Aug. 1980, pp. 1359–1367.
Satoh, et al., 1982 Symposium on VLSI Techn Digest of Papers (Sep., 1982), pp. 38–39.
Kwong, et al., Thin Solid Films, 161 (1988), pp. 131–137.
Rathnam, et al., IEDM 1983, pp. 237–241.

*Primary Examiner*—George R. Fourson
*Attorney, Agent, or Firm*—Cushman Darby & Cushman IP Group of Pillsbury Madison & Sutro LLP

[57] ABSTRACT

A method of manufacturing semiconductor devices yielding devices having impurity regions that are more shallow and exhibit less lateral diffusion than devices manufactured in accordance with prior art techniques. First, arsenic is introduced into a substrate. After the introduction of arsenic, phosphorus is introduced to the same portion of the substrate. The introductions of arsenic and phosphorus may be accomplished using diffusion or ion implantation techniques.

3 Claims, 3 Drawing Sheets

METHOD FOR MANUFACTURING SEMICONDUCTOR DEVICE

This is a continuation of U.S. application Ser. No. 08/194,644, filed on Feb. 10, 1994, which was abandoned upon the filling hereof which is a FWC of 08/049,670 filed Apr. 21, 1993, which is a FWC of 07/887,382 filed May 21, 1992, which is a FWC of 07/683,081 filed Apr. 9, 1991, which is a FWC of 07/279,621 filed Dec. 5, 1988, all abandoned.

BACKGROUND OF THE INVENTION

The present invention relates to a method of manufacturing a semiconductor device, and more particularly to a method of manufacturing an impurity region in the substrate of a semiconductor device.

In semiconductor fabrication technology, it is important to achieve active device characteristics as close to the ideal as possible while making dimensions small enough for VLSI applications. This requires reducing parasitic conduction paths and series resistances as well as maintaining threshold voltage control and minimizing the leakage current of the device. The more complex the layout of a semiconductor chip, the more difficult it is to deal with crossing wires, that is, conducting paths on the chip that overlap.

To minimize the wiring complexity on a chip, a so-called "buried contact" technique is usually employed in the fabrication process of a semiconductor device since it enables a more compact layout. A "buried contact" is essentially an ohmic connection between a doped semiconductor region (such as semiconductor substrate or impurity regions) and a highly conductive layer (such as polycrystalline silicon or metallization layers). In FET technology, "buried contacts" facilitate gate layout by providing means for electrical contact between the polysilicon and diffusion layers that do not require metal coverage as does the butting contact.

A conventional method of forming a buried contact in a FET process is shown in FIGS. 1a–1e (PRIOR ART). As shown in FIG. 1a, the starting silicon wafer is a lightly doped p-type substrate 1. The initial step is to define the field oxide layer 2 in order to expose those areas of silicon that will receive implantations or diffusions to form the required active devices. The field oxide layer 2 provides isolation between adjacent transistors. The isolation scheme could be enhanced by providing channel-stop implants into the isolation regions under the field oxide layer 2 (not shown in the figures for simplicity). A threshold-adjust implant could also be provided to set the desired threshold of the FET device (again not shown in the figures, for simplicity). A thin oxide film 3 is then formed. A buried-contact window (contact hole 5) is patterned by selectively etching the oxide film 3. This step is included in many design processes, for example, in the case of an NMOS inverter having a load device. The use of a load device makes it necessary to provide for a connection between the gate and source of the load transistor. In this case, the thin oxide film 3 actually represents the gate oxide.

After the formation of contact hole 5, a polycrystalline silicon (Poly Si) layer 4 is deposited on the entire surface of the substrate 1 (FIG. 1b) and doped n-type with either an implant or vapor doping using $POCl_3$ as a diffusion source, for example. Subsequently, the $n^+$-polysilicon layer 4 acts as a phosphorus doping source for the silicon exposed in the opened area of the oxide film (contact hole 5) to form an n-type impurity region 6 in the substrate 1, as shown in FIG. 1c. The Poly-Si layer 4 is then patterned by any conventional etching method either to form a wiring layer or to define the gates of the active devices as in the case of an inverter structure having driver and load devices (shown in FIG. 1d). Note that the Poly-Si layer 4 contacts the silicon at contact hole 5. The phosphorus used to dope the polysilicon can diffuse directly into the silicon below it, so that an ohmic contact exists between the polysilicon and the underlying $n^+$-region 6, thus, establishing a connection between the source and gate of the load device. The connection is made this way to avoid the additional space requirement that would be necessary if metal were used to strap the gate and source of the load together in the case of the above-mentioned NMOS inverter. After the patterning of the polysilicon, an $n^+$diffusion (or implant) is performed. This step requires no mask, since the field oxide and polysilicon define the diffusion regions 7, 8 and 9. In this particular case, the diffusion's purpose is not only to define the source and drain of the transistors, but also to provide a conducting path that interconnects the two transistors, as shown in FIG. 1e.

In practice, diffusion in microcircuits is always carried out through windows cut in the mask that is placed on the slice. The dopant source provides impurities which diffuse at right angles to the semiconductor surface as well as parallel to it (i.e., laterally). In the method described above, phosphorus is deeply diffused in both the vertical and horizontal directions. FIG. 2 shows the distribution of impurity concentration when the diffusion of phosphorus is performed at 900° C. for 40 minutes. The depth of the impurity region is about 0.6 $\mu$m [$X_j$ (vertical)]. The diffusion length in the lateral direction [$x_i$ (horizontal)] from the edge of the contact hole is about 0.45 $\mu$m [$x_i$ (horizontal)]=0.75×$X_j$ (vertical). In other words, the lateral penetration is about 75% of the penetration in the vertical direction for concentrations that are two or more orders of magnitude below the surface concentration. Lateral diffusion effects may result in a situation where the electric field associated with one impurity region will punch through to the adjacent impurity region due to the fact that the depletion regions surrounding the two adjacent n-type impurity regions are nearly touching under the field oxide layer, particularly at high applied voltages. Thus, lateral penetration facilitates the overlapping of adjacent depletion regions which, in turn, could short out the corresponding devices resulting in a considerable flow of current. This places a limitation on the allowable degree of device scaling and renders miniaturization of elements on a chip quite difficult.

Another disadvantage of the buried-contact scheme (in the particular example illustrated in the PRIOR ART figures) is that the depletion-mode transistor which is acting as the load of the NMOS inverter is not a self-aligned gate MOS field-effect transistor (MOSFET). The buried-contact mask defines the source diffusion of the load transistor, and the polysilicon mask defines the drain diffusion. Therefore, the channel length is subject to mask misalignment errors. In general, buried contacts are subject to a rather complex set of design rules, require an extra mask level, and sometimes reduce yield and reliability due to the above-mentioned problems.

SUMMARY OF THE INVENTION

It is an object of the present invention to provide an improved method of manufacturing a semiconductor device having shallow impurity regions.

It is another object of the present invention to provide an improved method of manufacturing a semiconductor device having shallow impurity regions in which lateral diffusion effects are reduced to manageable proportions.

It is, yet, another object of the present invention to provide an improved method of manufacturing a field-effect transistor having shallow impurity regions that minimize misalignment errors and having buried contacts of high reliability without the deleterious effects of the punch-through phenomena.

According to the invention, a method of manufacturing a semiconductor device comprises the steps of: introducing arsenic into a predetermined portion of a silicon body; and introducing phosphorus into said predetermined portion after said step of introducing arsenic, thereby forming in the silicon body an N-type impurity region including arsenic and phosphorous. The thus formed impurity region is shallow and has minimal lateral diffusion effects.

DESCRIPTION OF THE PREFERRED EMBODIMENTS

Figure 1A:
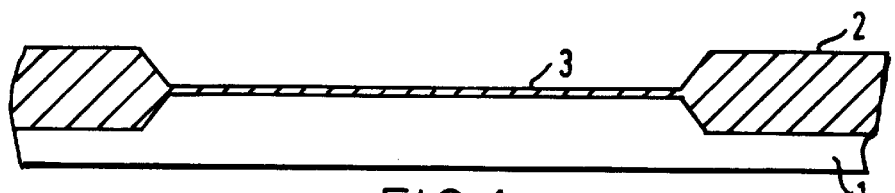
FIG. 1a–1e (Prior Art) illustrate a conventional method of manufacturing a semiconductor device having impurity regions and buried contacts.
Figure 1B:
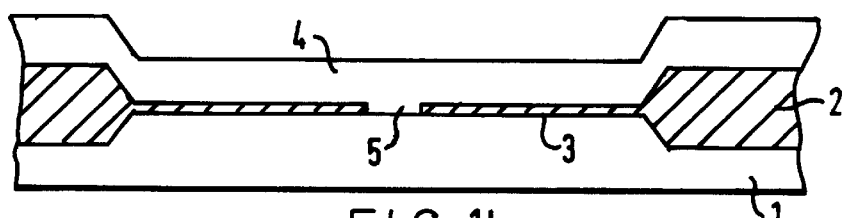
Figure 1C:
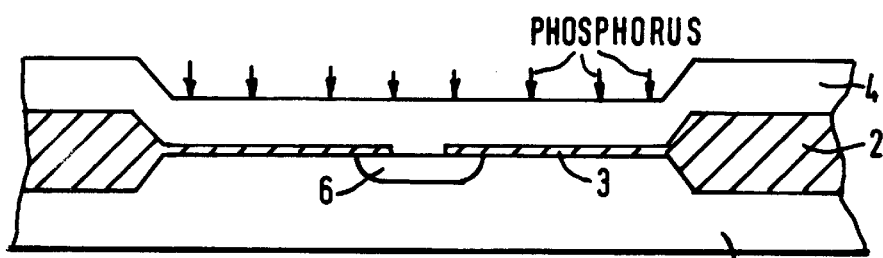
Figure 1D:
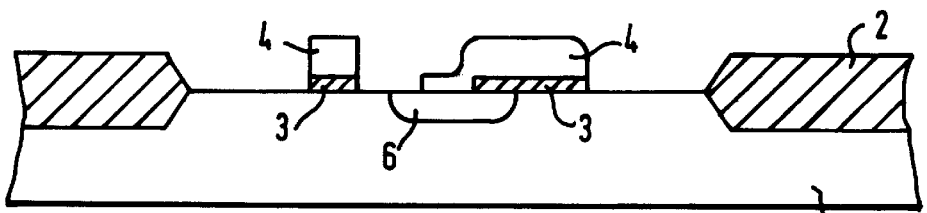
Figure 1E:
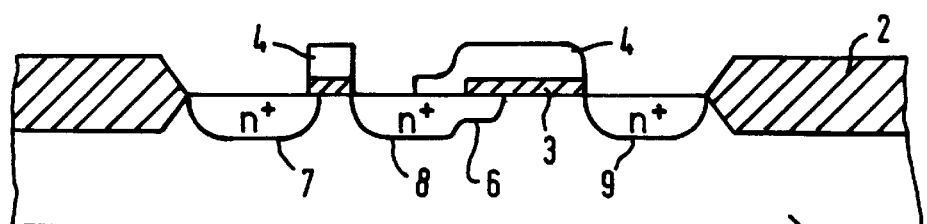
Figure 2:
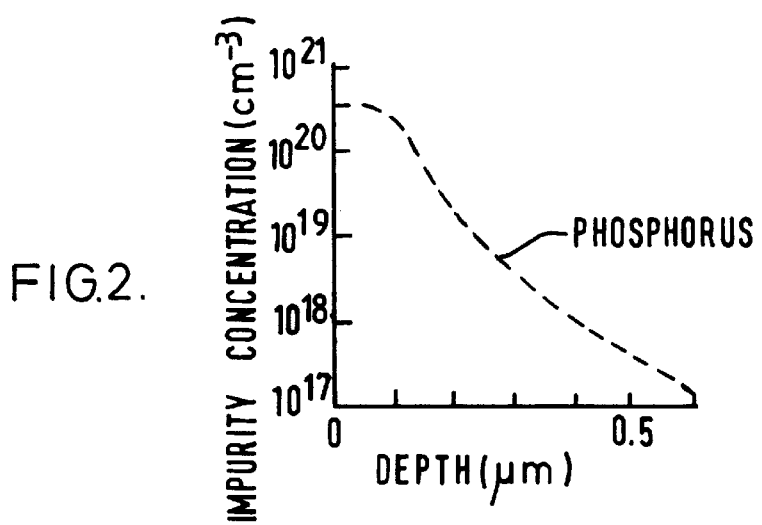
FIG. 2 is a graph showing the distribution of impurity concentration according to the conventional method.
Figure 3A:
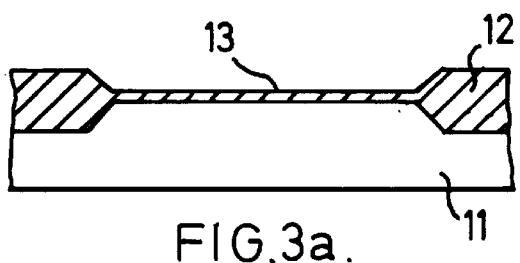
FIGS. 3a–3c illustrate a process in accordance with one embodiment of the present invention.
Figure 3B:
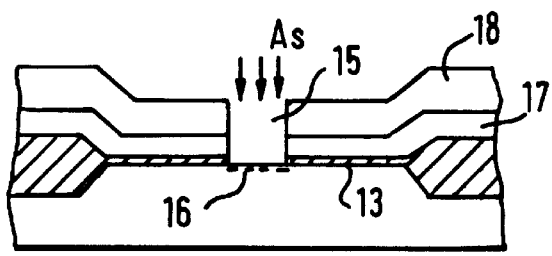
Figure 3C:
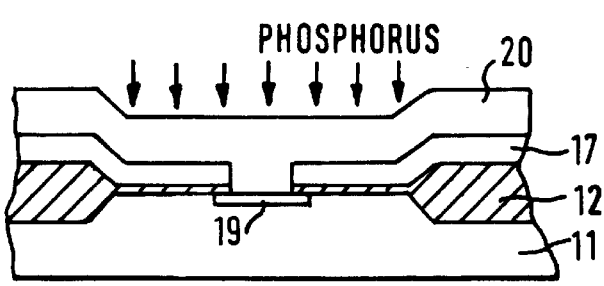

FIGS. 3a–3c are sectional views depicting a process in accordance with a first embodiment of the present invention to form a buried contact. With reference to FIG. 3a, the initial step is isolation patterning, wherein a field oxide layer 12 having a thickness of 3000–5000 Å is formed by selectively oxidizing the surface of a P-type monocrystalline silicon substrate 11 to expose those areas of silicon that will receive implantations or diffusions. An N-type silicon substrate with a P-type well may be employed instead of the P-type silicon substrate 11. An insulating film 13 having a thickness of 100–150 Å is formed by oxidation on the exposed surface of the Si substrate which is surrounded by the field oxide layer 12.

Referring to FIG. 3b, a first Poly-Si layer 17 having a thickness of about 1000 Å is formed by blanket deposition on the entire surface using low pressure chemical vapor deposition (LPCVD) for the protection of the oxide film 13. At this time, as a pre-treatment of Poly-Si deposition, a chemical treatment which does not contain HF may be carried out. Then, a photoresist 18 is formed having a window patterned in accordance with the buried contact portion. Using the photoresist 18 as a mask, first Poly-Si layer 17 is selectively removed by reactive ion etching (RIE) and the oxide film 13 is also selectively removed by wet etching with $NH_4F$ to expose the substrate 11. Thus, a contact window 15 is formed in the buried contact portion. Arsenic is introduced through the contact hole 15 into the substrate at the buried contact portion by ion implantation at an acceleration energy of 40 KeV and at a dose of $1\times10^{15}$ $cm^{-2}$ to form an impurity region 16. Alternatively, the oxide film 13 grown on the surface of the buried contact portion may be removed after the ion implantation of arsenic.

Figure 4:
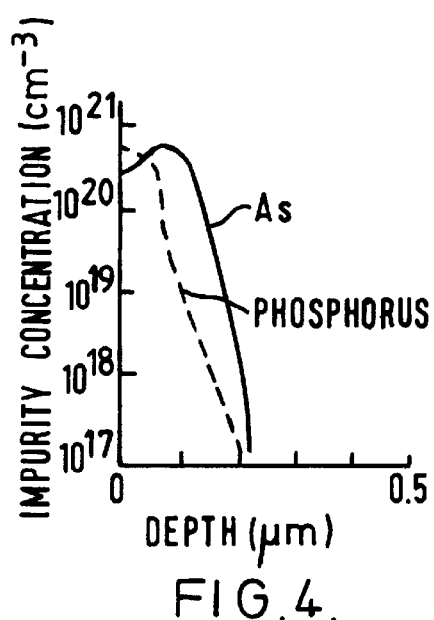
FIG. 4 is a graph showing the distribution of impurity concentration according to the embodiment of the present invention shown in FIGS. 3a–3c.

Referring to FIG. 3c, after the removal of photoresist 18, a second Poly Si layer 20 having a thickness of 3000 Å is formed by blanket deposition on the entire surface using LPCVD in an atmosphere of oxygen with the concentration of ppm order. Phosphorus is diffused for 30–40 minutes at 900° C. through second Poly-Si layer 20 into the substrate at the buried contact portion using $POCL_3$ as a diffusion source. Thus, an impurity region 19 into which both arsenic and phosphorus have been introduced is formed. Then, first and second Poly-Si layers are patterned by a conventional etching process to form either a wiring layer or a gate layer. In this embodiment, the distribution of phosphorus in the impurity region 19 is more shallow than that of arsenic as shown in FIG. 4. Phosphorus diffuses to a level that is more shallow when compared with the prior art process in which arsenic is not implanted into the substrate. This is a phenomenon discovered by the applicant. In this way, a shallow impurity region is obtained and excellent field punch-through characteristics and high packing densities are achieved without the formation of parasitic conduction paths between isolated devices on a chip.

Alternatively, ion implantation of arsenic in the above-mentioned embodiment may be performed after the deposition of second Poly-Si layer 20. Such ion implantation destroys the native oxide formed between second Poly-Si layer 20 and the substrate 11. In this case, a second Poly-Si layer 20 having a thickness of about 500 Å is desirable. Moreover, the formation of the first Poly-Si layer 17 may be omitted. The subsequent steps are performed in accordance with the desired layout, for example, the inverter circuit layout shown in the prior art.

Figure 5A:
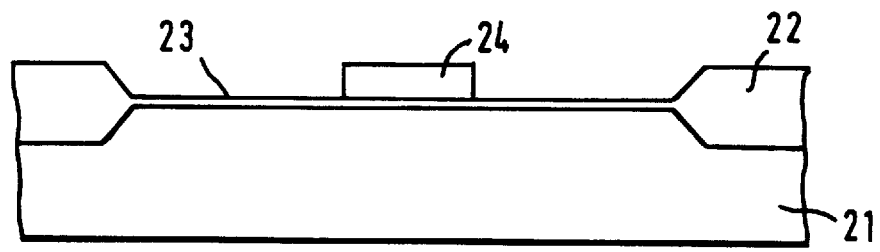
FIGS. 5a–5d illustrate a process in accordance with a second embodiment of the present invention.

FIGS. 5a–5d are sectional views depicting a process in accordance with a second embodiment of the present invention to form source and drain impurity regions of a MOS transistor. With reference to FIG. 5a, the initial step is isolation patterning, wherein a field oxide layer 22 having a thickness of 3000–5000 Å is formed by selectively oxidizing the surface of a P-type silicon substrate 21 to expose those areas of silicon that will receive implantations or diffusions. An N-type silicon substrate with a P-type well may be employed instead of the P-type silicon substrate 21. A gate oxide film 23 having a thickness of 100–150 Å is formed by oxidation on the exposed surface of the Si-substrate which is surrounded by the field oxide layer 22. A threshold-adjust implant in which boron is introduced into the substrate in the device active area surrounded by the field oxide layer 22 is performed. Then, a Poly-Si gate electrode 24 is formed on the gate oxide film 23.

Figure 5B:
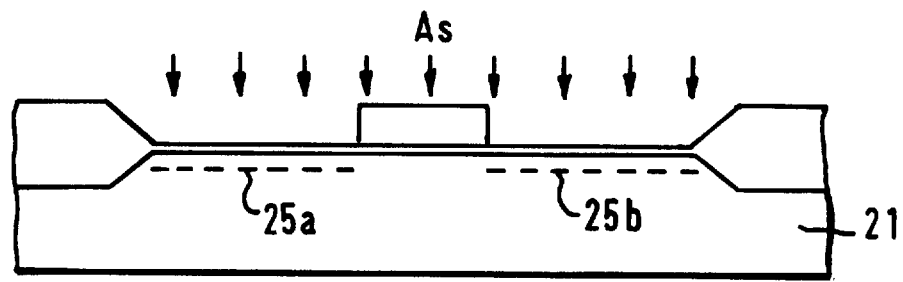
Figure 5C:
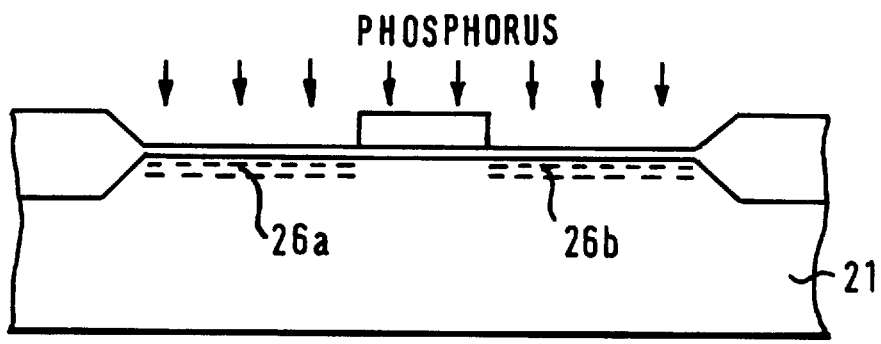

Referring to FIG. 5b, arsenic is introduced into the substrate by ion implantation at an acceleration energy of 40–60 KeV and at a dose of $1\times10^{15}$–$5\times10^{15}$ $cm^{-2}$ to form source and drain impurity regions 25a and 25b. Then, as shown in FIG. 5c, phosphorus is introduced into source and drain formation regions by ion implantation at an acceleration energy of 20–30 KeV and at a dose of $1\times10^{15}$–$5\times10^{15}$ $cm^{-2}$ to form source and drain impurity regions 26a and 26b. The acceleration energies of arsenic and phosphorus are chosen to make the peak depth of phosphorus concentration more shallow than that of arsenic concentration.

Figure 5D:
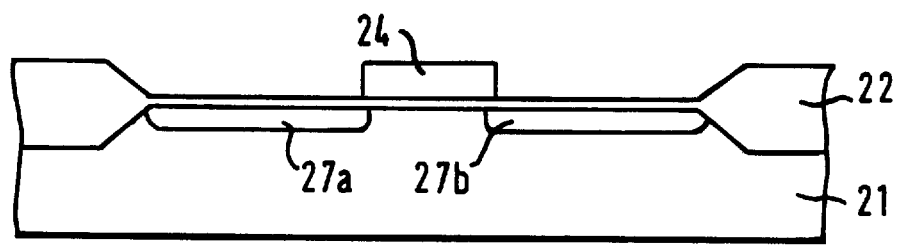

Arsenic and phosphorus impurities are activated by heat treatment to form a source region 27a and a drain region 27b, as shown in FIG. 5d. Alternatively, arsenic and phosphorus may be introduced into the substrate 21 after the selective removal of the gate oxide film 23 from the surface of the source and drain formation regions. Moreover, phosphorus may be introduced using a diffusion source.

In this embodiment, phosphorus does not deeply diffuse into the substrate during heat treatment, so that shallow source and drain regions are obtained. The formed impurity regions have high junction breakdown voltages due to the smooth profile at the edge portion of the phosphorus implant. Moreover, lateral diffusion is also minimized so that self-alignment of the source and drain regions to the gate electrode layer is achieved with minimal overlapping. Therefore, this method is well suited to the manufacturing of semiconductor devices with high packing densities and minimum parasitic conductive paths.

What is claimed is:

1. A method of manufacturing a semiconductor device comprising the steps of:

providing a silicon substrate having an active area located at a surface of the substrate;

patterning an insulating film on the surface of the substrate;

depositing a first polysilicon layer on the insulating film;

forming a patterned photoresist on the first polysilicon layer;

anisotropically etching at least the first polysilicon layer and the insulating film while using the patterned photoresist as a mask to define a passage above the active area that exposes the active area of the silicon substrate;

passing arsenic through the passage and implanting the arsenic into the active area of the silicon substrate;

removing the photoresist;

depositing a first portion of a second polysilicon layer on the first polysilicon layer;

depositing a second portion of the second polysilicon layer in the passage to cover the active area of the silicon substrate;

diffusing phosphorus through the second portion of the second polysilicon layer and into the active area of the silicon substrate while the active area remains covered by the second portion of the second polysilicon layer; and patterning the second polysilicon layer to form a wiring layer.

2. (Amended) A method according to claim 1, wherein said step of implanting arsenic into the active area of the silicon substrate is conducted at a first acceleration energy and wherein said step of diffusing phosphorus through the second portion of the second polysilicon layer and into the active area of the silicon substrate is conducted such that the peak depth of phosphorus concentration is shallower than the peak depth of arsenic concentration.

3. (New) A method according to claim 2, further comprising the step of annealing the silicon substrate to thereby diffuse the arsenic and phosphorus to form an n-type impurity region in the silicon substrate, the n-type impurity region comprising arsenic and phosphorus.

* * * * *